US009412606B2

(12) United States Patent
Liao et al.

(10) Patent No.: US 9,412,606 B2
(45) Date of Patent: Aug. 9, 2016

(54) TARGET DIMENSION UNIFORMITY FOR SEMICONDUCTOR WAFERS

(71) Applicant: Taiwan Semiconductor Manufacturing Company Limited, Hsin-Chu (TW)

(72) Inventors: Han-Wen Liao, Taichung (TW); Chih-Yu Lin, Tainan (TW); Cherng-Chang Tsuei, Hsin-Chu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 53 days.

(21) Appl. No.: 14/180,385

(22) Filed: Feb. 14, 2014

(65) Prior Publication Data

US 2015/0235877 A1 Aug. 20, 2015

(51) Int. Cl.
*H01L 21/3065* (2006.01)

(52) U.S. Cl.
CPC .................................. *H01L 21/3065* (2013.01)

(58) Field of Classification Search
None
See application file for complete search history.

(56) References Cited

U.S. PATENT DOCUMENTS

2004/0110389 A1* 6/2004 Ho .................... H01J 37/32495 438/710
2004/0231800 A1* 11/2004 Singh .................. C23C 16/4404 156/345.48
2006/0000797 A1* 1/2006 Adams .............. H01J 37/32082 216/37
2007/0215282 A1* 9/2007 Itabashi ............ H01J 37/32082 156/345.33
2011/0226734 A1* 9/2011 Sumiya ............. H01J 37/32192 216/41
2013/0115418 A1* 5/2013 Young-Dohe ............. C23C 4/02 428/141

OTHER PUBLICATIONS

Corresponding Taiwanese application, Taiwanese Office action dated Feb. 17, 2016, 6 pages.

* cited by examiner

*Primary Examiner* — Shamim Ahmed
(74) *Attorney, Agent, or Firm* — Cooper Legal Group, LLC

(57) ABSTRACT

One or more systems and methods for controlling a target dimension for a wafer are provided. A processing chamber, such as an etching chamber, is configured to etch one or more wafers. In some embodiments, during processing of a first wafer of a set of wafers, the processing chamber is coated with a relatively thicker chamber coating than chamber coatings used for subsequently processed wafers of the set of wafers. The increased chamber coating thickness results in the first wafer having a target dimension that is substantially similar to target dimensions of the subsequently processed wafers. In some embodiments, a post wafer cleaning process is performed, but a pre wafer cleaning process is disabled, between processing a final wafer of a first set of wafers and an initial wafer of a second set of wafers so that the final wafer and the initial wafer have substantially similar target dimensions.

20 Claims, 13 Drawing Sheets

TARGET DIMENSION UNIFORMITY FOR SEMICONDUCTOR WAFERS

BACKGROUND

Semiconductor arrangements, such as integrated circuits, comprise structures that perform various functionality. For example, a gate structure of a transistor controls current flowing through a channel of the transistor, generally to serve as a switch within an integrated circuit. Etching processes and masks are used to define and form structures of a semiconductor arrangement. In an example, a mask is formed over a layer of material. An etching process is performed through the mask to etch portions of the layer not protected by the mask. In this way, portions of the layer are etched away to define a structure for the semiconductor arrangement.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
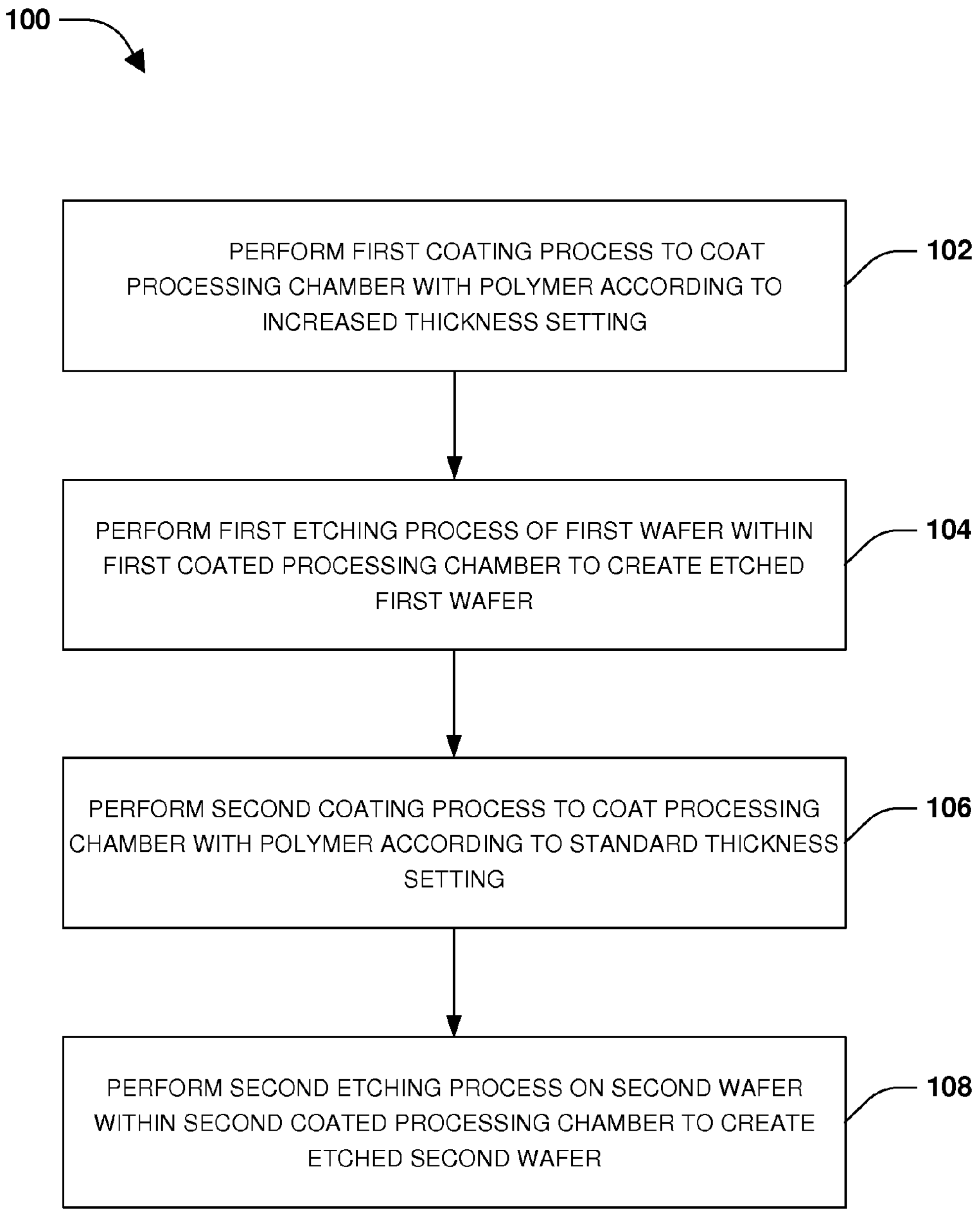
FIG. 1 is a flow diagram illustrating a method of controlling a target dimension for a wafer, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more systems and techniques for controlling a target dimension for a wafer are provided. Wafers, upon which semiconductor arrangements are to be formed, are processed within a processing chamber, such as an etching chamber that etches layers of, or formed upon, the wafers according to a target dimension. The target dimension corresponds to a width, a length, a distance between two structures, or other design constraints for structures that are to be formed from material of the etched layers, such as a gate structure, a source structure, a drain structure, a metal structure, a via structure, or other structures of a semiconductor arrangement.

In some embodiments, a set of wafers are to be processed within the processing chamber according to a target dimension. Because conditions of the processing chamber, such as temperature, are different for a first wafer of the set of wafers than subsequently processed wafers, processing of the first wafer will result in a target dimension that is different, such as smaller, than target dimensions of the subsequently processed wafers. Accordingly, as provided herein, the processing chamber is coated with a material, such as a polymer, according to an increased thickness setting to create a first coated processing chamber having a first coating thickness. The first coating thickness is relatively thicker than coating thicknesses of coatings applied to the processing chamber during subsequent processing of subsequently processed wafers. In this way, the first wafer is etched within the first coated processing chamber having the relatively thicker coating thickness to create an etched first wafer. The etched first wafer has a first target dimension corresponding to target dimensions of the subsequently processed wafers. Thus, the set of wafers have relatively similar target dimensions.

In some embodiments, a first set of wafers and a second set of wafers are to be processed within a processing chamber according to a target dimension. A chamber cleaning component performs a post wafer cleaning process of the processing chamber after a final wafer of the first set of wafers is finished being processed by the processing chamber. The post wafer cleaning process leaves a residual amount of a cleaning byproduct, such as fluorine, that can affect target dimensions of wafers, such as an initial wafer of the second set of wafers that is processed after the final wafer of the first set of wafers. Because a pre wafer cleaning process between the final wafer of the first set of wafers and the initial wafer of the second set of wafers can increase the residual amount of cleaning byproduct within the processing chamber and thus further affect/change target dimensions of wafers within the second set of wafers, the pre wafer cleaning process is disabled between the final wafer and the initial wafer. In this way, the processing chamber has similar amounts of the cleaning byproduct during processing of the first set of wafers and the second set of wafers so that such wafers have similar target dimensions.

A method 100 of controlling a target dimension for a wafer is illustrated in FIG. 1. A processing chamber, such as a dry etching chamber, is configured to process a set of wafers according to the target dimension. In some embodiment, the target dimension comprises a width, a length, a spacing between two structures, or other design constraints for structures, such as a gate structure, that are to be formed during processing. Because initial conditions, such as temperature, within the processing chamber are different when processing a first wafer of the set of wafers than conditions of the processing chamber when processing subsequent wafers, a first target dimension of the first wafer would be different, such as smaller, than target dimensions of the subsequently processed wafers. In this way, the first wafer is scrapped or a dummy wafer is used as the first wafer, which affects cost and output. Accordingly, as provided herein, the processing chamber is coated with a relatively thicker coating of a material, such as a polymer, for processing the first wafer. Coating the processing chamber with the relatively thicker coating will increase the first target dimension of the first wafer so that the first target dimension corresponds to, such as being substantially similar to, target dimensions of the subsequently processed wafers.

During processing of the first wafer within the processing chamber, a first coating process is performed to coat the processing chamber with a material, such as a polymer, according to an increased thickness setting, resulting in a first coated processing chamber, at 102. The first coated processing chamber comprises a first chamber coating having a first coating thickness. In some embodiments, the first coating thickness is between about 1000 angstroms to about 1400 angstroms. In some embodiments, the first coating process is performed for a first coating duration that is longer than subsequent coating durations used to coat the processing chamber for subsequently processed wafers. In some embodiments, the first chamber coating is formed over a cathode and an anode of the processing chamber to decrease a delta voltage associated with the cathode and the anode. Decreasing the delta voltage reduces a plasma ion energy that decreases an etching rate for a first etching process that will be performed on the first wafer. Decreasing the etching rate for the first etching process will increase a first target dimension of the first wafer so that the first target dimension corresponds to, such as being substantially similar to, target dimensions of subsequently processed wafers.

At 104, performance of the first etching process on the first wafer within the first coated processing chamber is initialized to create an etched first wafer. The first etching process is configured to etch a source material, a drain material, a poly material, solid source diffusion (SSD), a main side wall (MSW), a contact, a via, a metal, or other material of the first wafer. In some embodiments, the first etching process is associated with a single pattern etch, a double pattern etch, or a multi-pattern etch.

During processing of a second wafer within the processing chamber, a second coating process is performed to coat the processing chamber with the material according to a standard thickness setting, resulting in a second coated processing chamber, at 106. In some embodiments, the second wafer is processed after the first wafer. The second coated processing chamber has a second coating thickness that is different than the first coating thickness used to process the first wafer. In some embodiments, the first coating thickness is larger than the second coating thickness. In some embodiments, the second coating process is performed for a second coating duration that is shorter than the first coating duration, such that the second coating thickness is smaller than the first coating thickness.

At 108, performance of a second etching process on the second wafer within the second coated processing chamber is initialized to create an etched second wafer. The second etched wafer has a second target dimension that corresponds to, such as being substantially similar to, the first target dimension of the first wafer. In this way, target dimension uniformity is achieved for wafers within the set of wafers.

In some embodiments, a previous set of wafers were processed within the processing chamber before processing of the first wafer. After processing of a previous wafer within the processing chamber and before performing the first coating process, a post wafer cleaning process of the processing chamber is performed. A pre wafer cleaning process is disabled between processing of the previous wafer and processing of the first wafer to reduce an amount of a cleaning by-product, such as fluorine, that remains in the processing chamber for processing of the first wafer. Because the cleaning by-product would otherwise affect the first target dimension of the first wafer, reducing the amount of the cleaning by-product results in the first target dimension corresponding to target dimensions of other wafers within the first set of wafers.

Figure 2A:
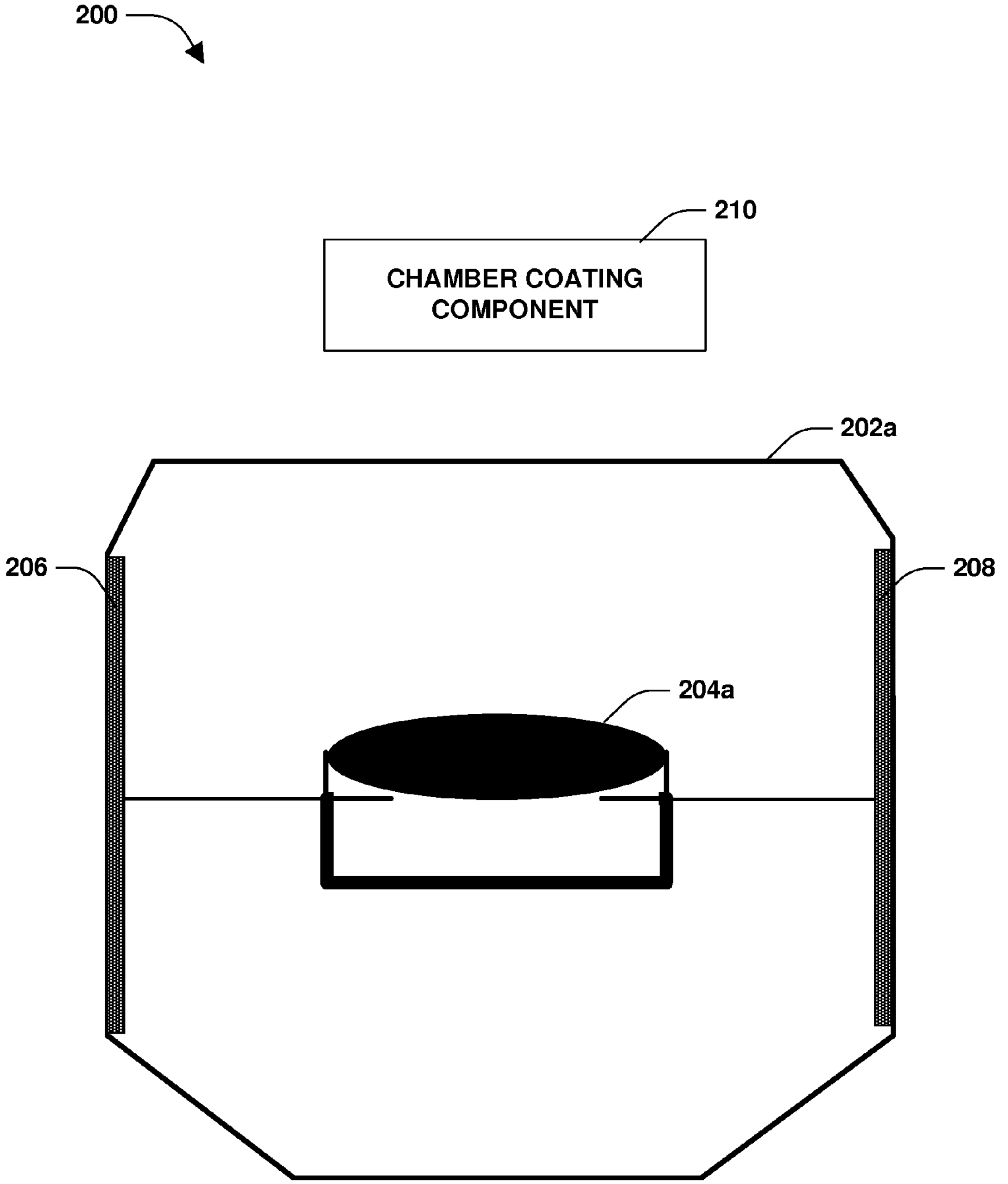
FIG. 2A is an illustration of a first wafer within a processing chamber, in accordance with some embodiments.

FIGS. 2A-2G illustrate a system 200 for controlling target dimensions of wafers within a set of wafers. The system 200 comprises a chamber coating component 210 associated with a processing chamber 202*a*, such as an etching chamber, as illustrated in FIG. 2A. The processing chamber 202 comprises a cathode 206 and an anode 208 that aid in etching the set of wafers, such as a first wafer 204*a*, based upon a delta voltage associated with the cathode 206 and the anode 208. The delta voltage affects a plasma ion energy, within the processing chamber 202*a*, which correlates to an etching rate for an etching process performed within the processing chamber 202*a*. In some embodiments, a decrease in the delta voltage will reduce the plasma ion energy, resulting in a decrease to the etching rate. Decreasing the etching rate will increase a target dimension of a wafer being etched. Because conditions of the processing chamber 202*a*, such as temperature, are different for the first wafer 204*a* than subsequently processed wafers, a target dimension for the first wafer 204*a* will be smaller than target dimensions of the subsequently processed wafers, which will negatively impact target dimension uniformity for the set of wafers. Accordingly, the chamber coating component 210 is configured to coat the processing chamber 202*a* with a material, such as a polymer, that will decrease the delta voltage. Decreasing the delta voltage will decreased the plasma ion energy, resulting in a decreased etching rate. The decreased etching rate will increase the target dimension for the first wafer 204*a* so that the first target dimension of the first wafer 204*a* is substantially similar to target dimensions of subsequently processed wafers.

Figure 2B:
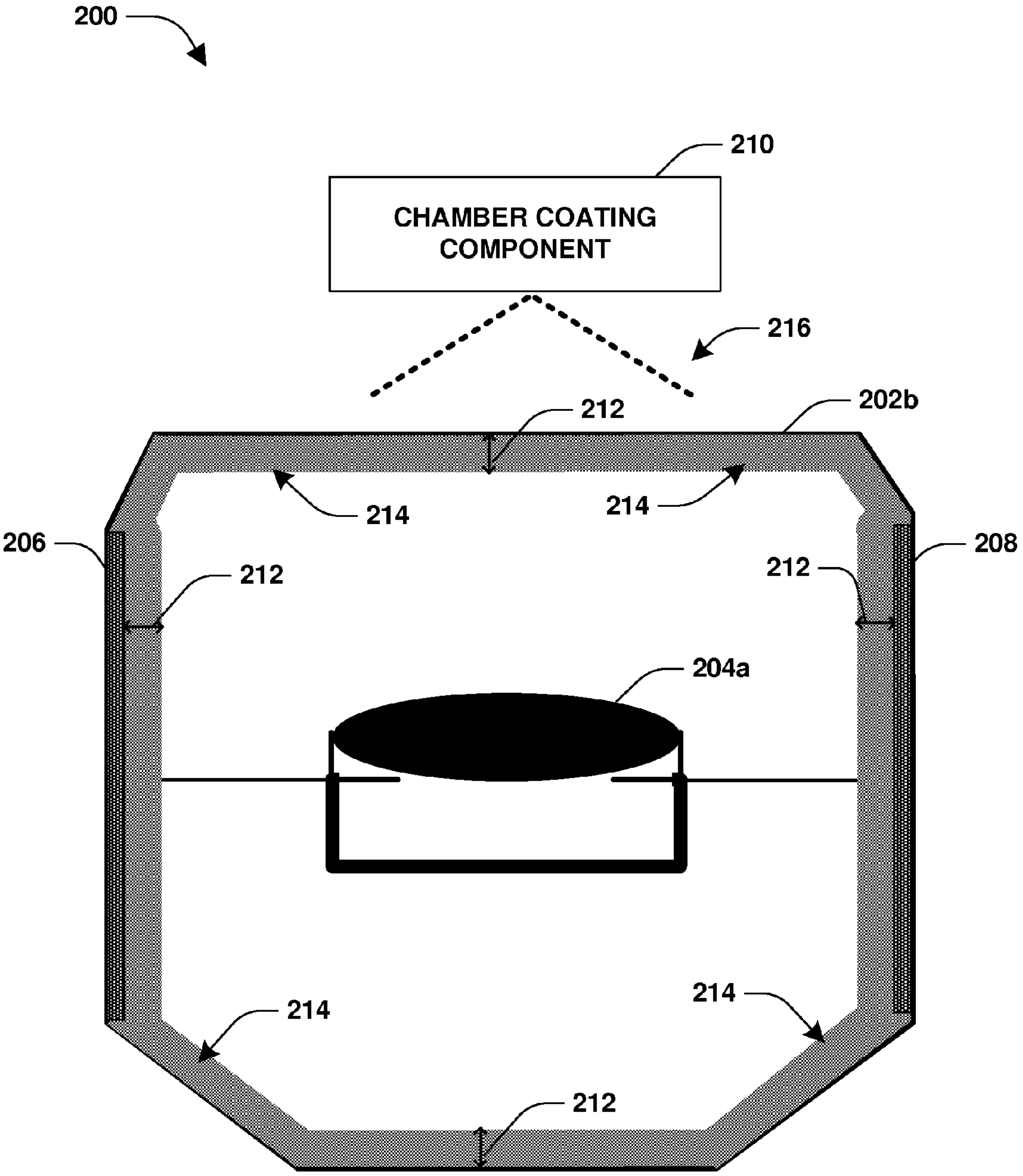
FIG. 2B is an illustration of a first wafer within a first coated processing chamber, in accordance with some embodiments.

In some embodiments, the chamber coating component 210 identifies the first wafer 204*a* to be etched by a first etching process within the processing chamber 202*a*. The chamber coating component 210 is configured to perform a first coat process 216 to coat the processing chamber 202*a* with the material according to an increased thickness setting, resulting in a first coated processing chamber 202*b*, as illustrated in FIG. 2B. The first coated processing chamber 202*b* comprises a first chamber coating 214 having a first coating thickness 212. In some embodiments, the first coating thickness 212 is between about 1000 angstroms and about 2000 angstroms. In some embodiments, the chamber coating component 210 performs the first coating process 216 for a first coating duration. In some embodiments, the first coating duration is longer than subsequent coating durations of subsequent coating processes for subsequently processed wafers. In some embodiments, the first coating duration is between about 1 second and about 7 seconds longer than subsequent coating durations. In some embodiments, the first coating duration is about 2 seconds longer, which increases the first coating thickness 212 by about 0.7 nm. In some embodiments, the cathode 206 and the anode 208 are coated with the first chamber coating 214 to decrease the delta voltage.

Figure 2C:
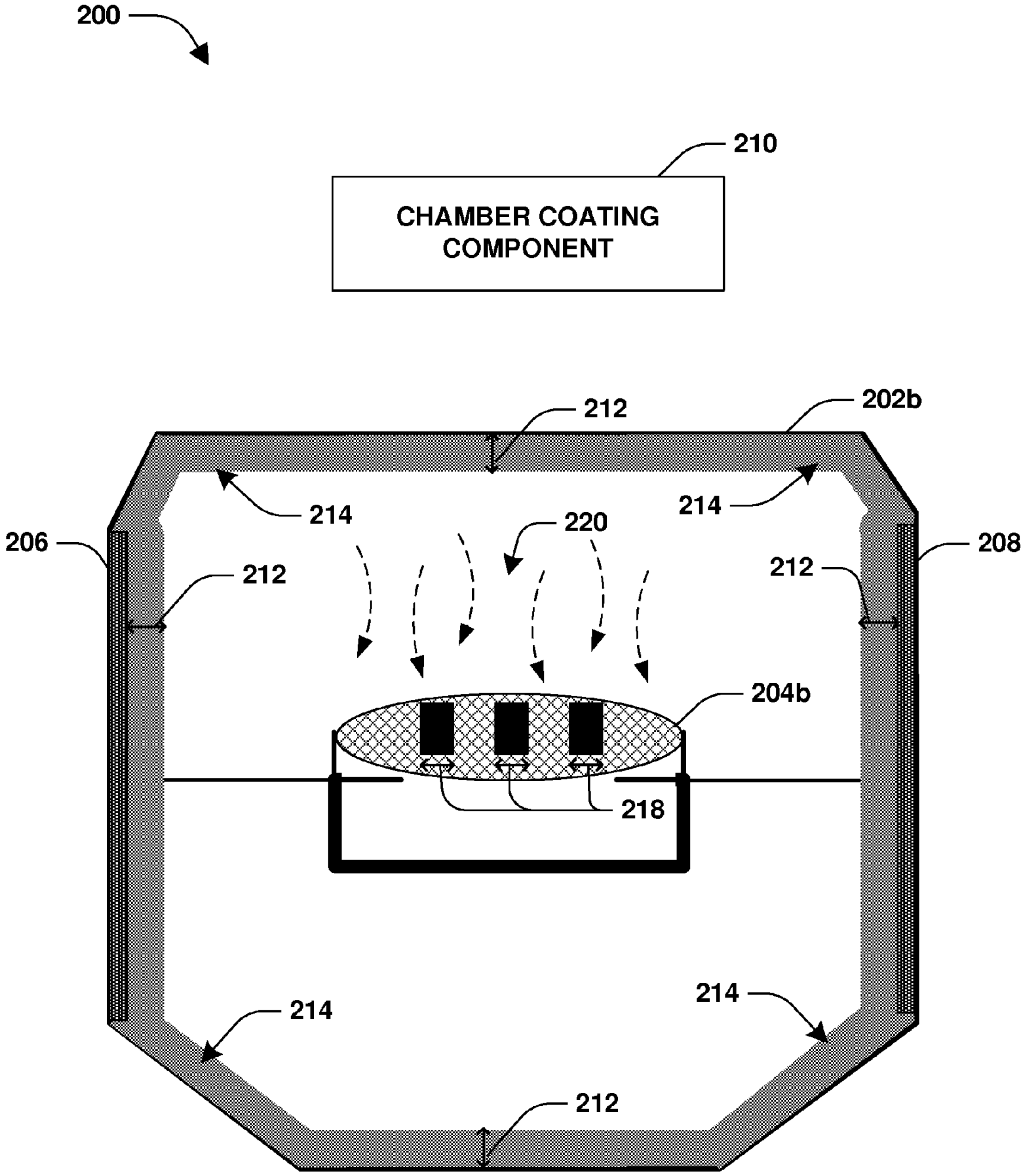
FIG. 2C is an illustration of performing a first etching process on a first wafer within a first coated processing chamber, in accordance with some embodiments.

The chamber coating component 210 is configured to initiate a first etching process 220 on the first wafer 204*a* within the first coated processing chamber 202*b* to create an etched first wafer 204*b*, as illustrated in FIG. 2C. Because the delta voltage is decreased between the cathode 206 and the anode 208, an etching rate of the first etching process 220 is decreased, resulting in the first etched wafer 204*b* having a first target dimension 218 that is larger than if the delta voltage was not decreased by the first chamber coating 214. In some embodiments, the first target dimension 218 is substantially similar to target dimensions of subsequently processed wafers. In some embodiments, the first target dimension 218 corresponds to a width of structures, such as gate structures, formed within the etched first wafer 204*b*

Figure 2D:
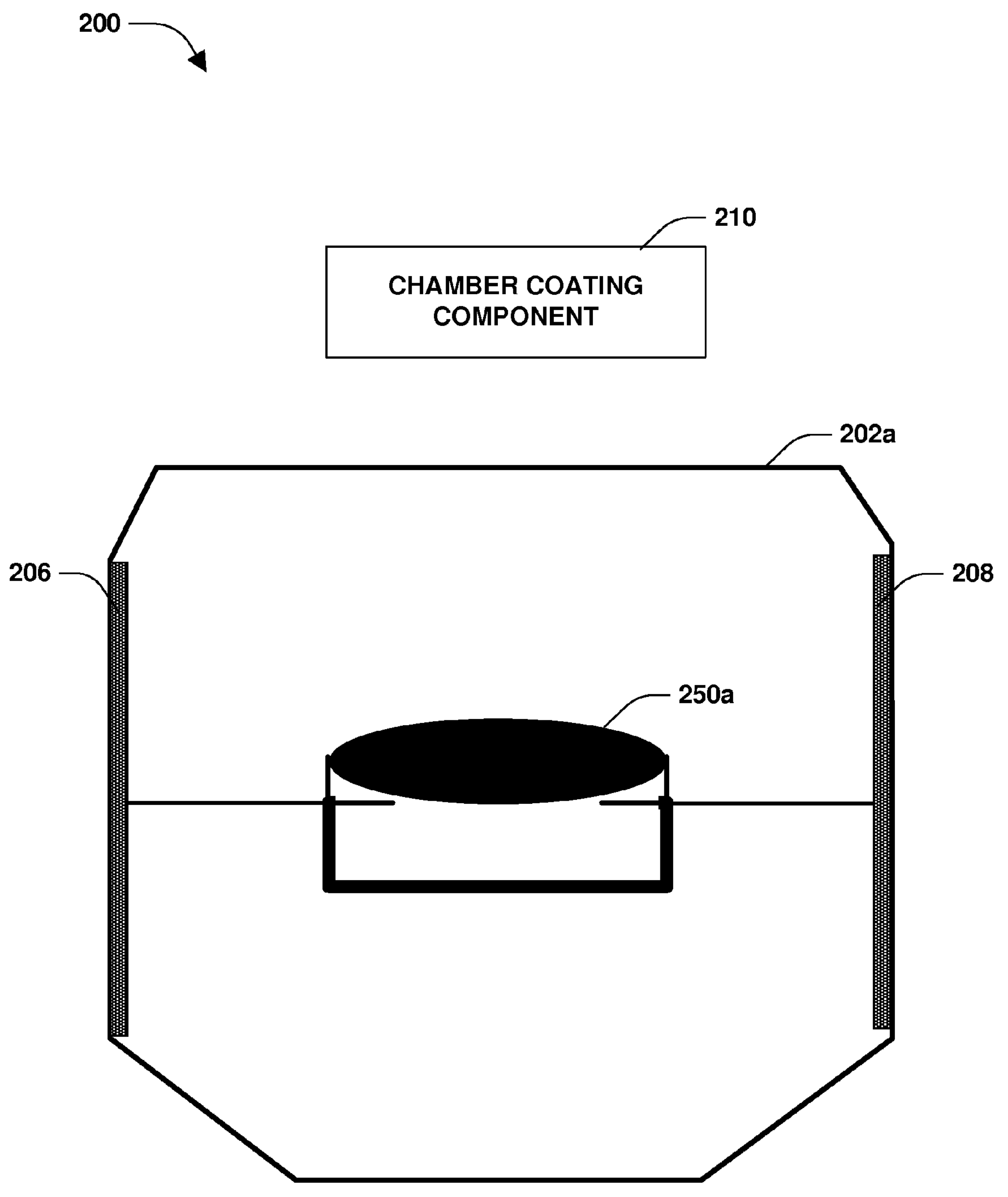
FIG. 2D is an illustration of a second wafer within a processing chamber, in accordance with some embodiments.
Figure 2E:
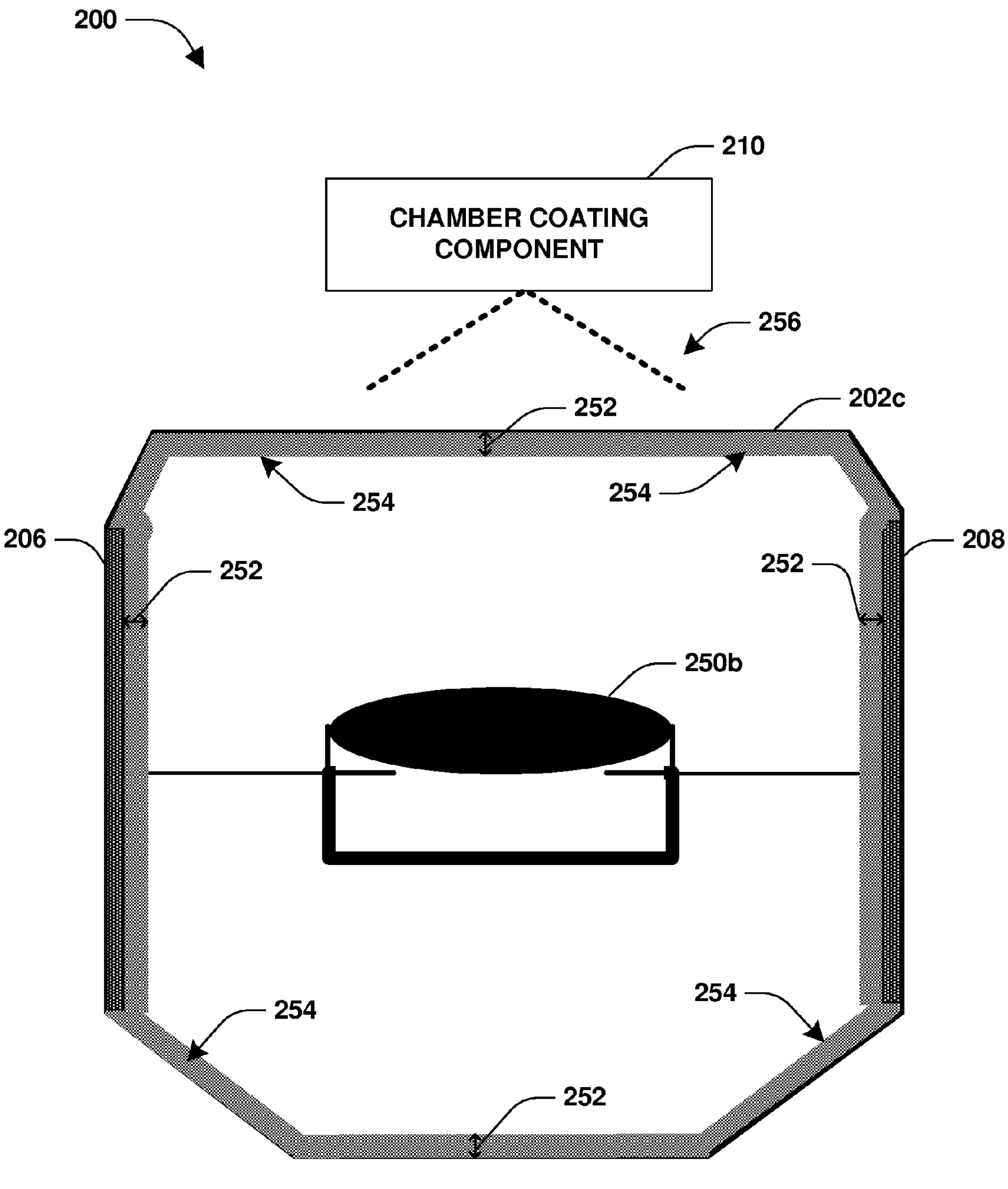
FIG. 2E is an illustration of a second wafer within a second coated processing chamber, in accordance with some embodiments.

The chamber coating component 210 is configured to identify a second wafer 250*a* of the set of wafers that is to be subsequently etched by a second etching process 256 within the processing chamber 202*a*, as illustrated in FIG. 2D. The chamber coating component 210 is configured to perform the second coating process 256 to coat the processing chamber 202*a* with the material according to a standard thickness setting, resulting in a second coated processing chamber 202*c*, as illustrated in FIG. 2E. The second coated processing chamber 202*c* comprises a second chamber coating 254 having a second coating thickness 252 that is different than, such as smaller than, the first coating thickness 212 of the first chamber coating 214. In some embodiments, the chamber coating component 210 performs the second coating process 256 for a second coating duration that is different than, such as shorter than, the first coating duration of the first coating process 216.

Figure 2F:
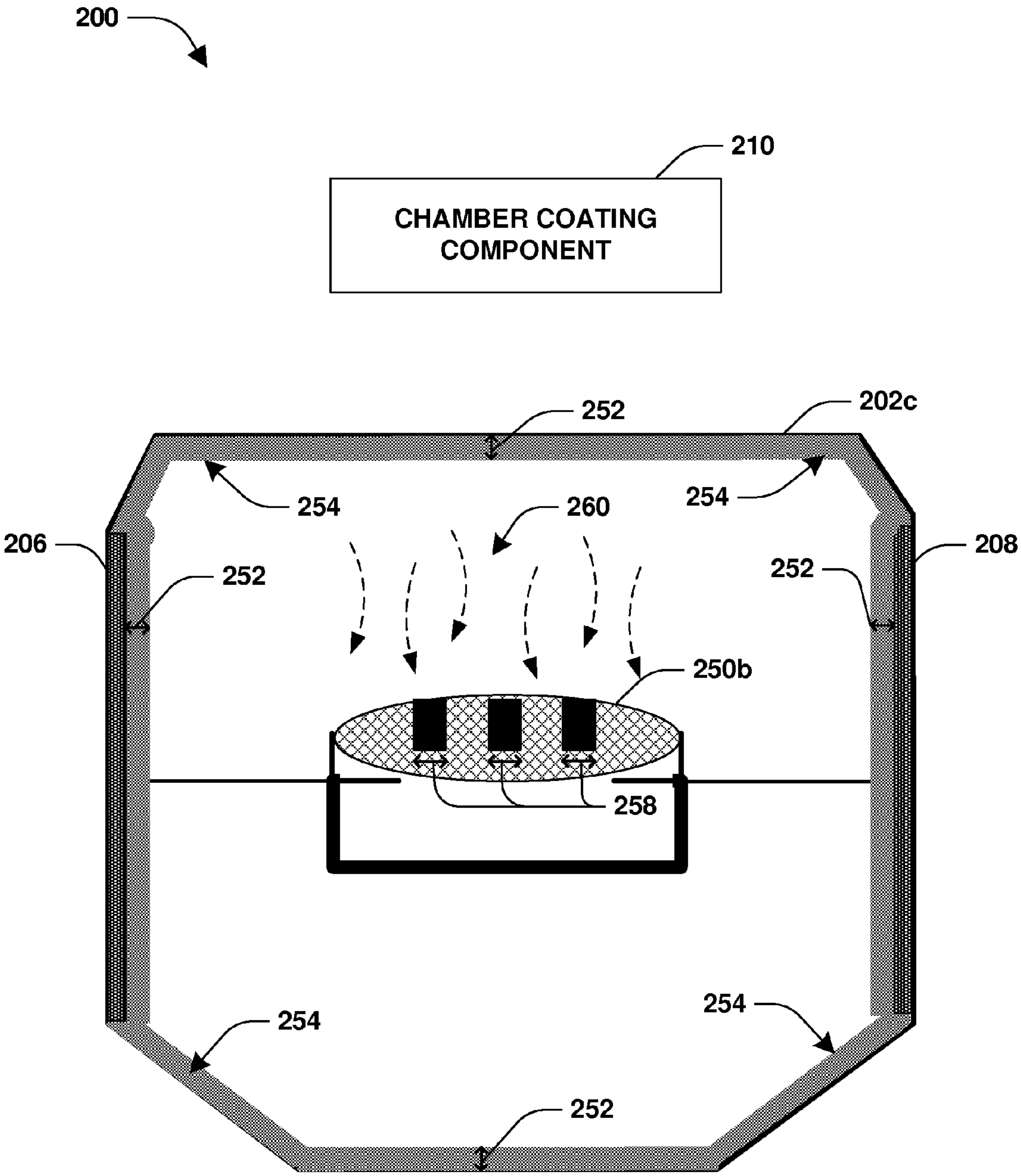
FIG. 2F is an illustration of performing a second etching process on a second wafer within a second coated processing chamber, in accordance with some embodiments.
Figure 2G:
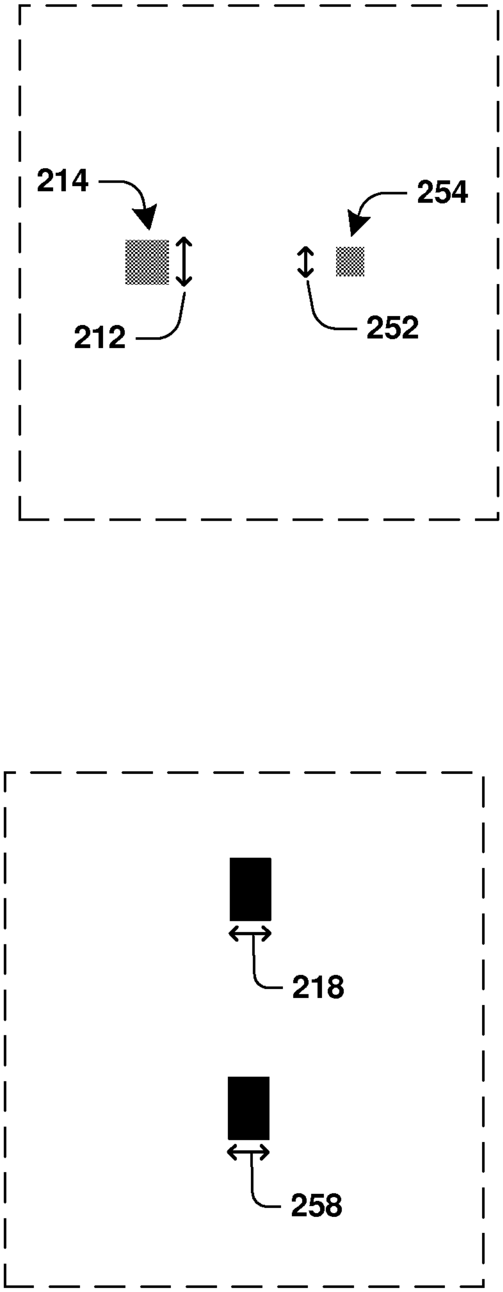
FIG. 2G is an illustration of a comparison of first coating thickness and a second coating thickness, and a comparison of a first target dimension and a second target dimension.

The chamber coating component 210 is configured to initiate a second etching process 260 on the second wafer 250*a* within the second coated processing chamber 202*c* to create an etched second wafer 250*b*, as illustrated in FIG. 2F. The second etched wafer 250*b* has a second target dimension 258. In some embodiments, the second target dimension 258 corresponds to a width of structures, such as gate structures, formed within the etched second wafer 250*b*. The second target dimension 258 of the second etched wafer 250*b* corresponds to, such as being substantially similar to, the first target dimension 218 of the first etched wafer 204*b*, as illustrated by FIG. 2G. The first target dimension 218 corresponds to the second target dimension 258 because the first chamber coating 214, used for creating the first etched wafer 204*b*, had the first coating thickness 212 that is larger than the second coating thickness 252 of the second chamber coating 254 used for creating the second etched wafer 250*b*. The increase in coating thickness resulted in an increase to the first target dimension 218 that would otherwise have been smaller than the second target dimension 258 due to conditional differences, such as temperatures, of the processing chamber during the first etching process 216 and the second etching process 256.

Figure 3A:
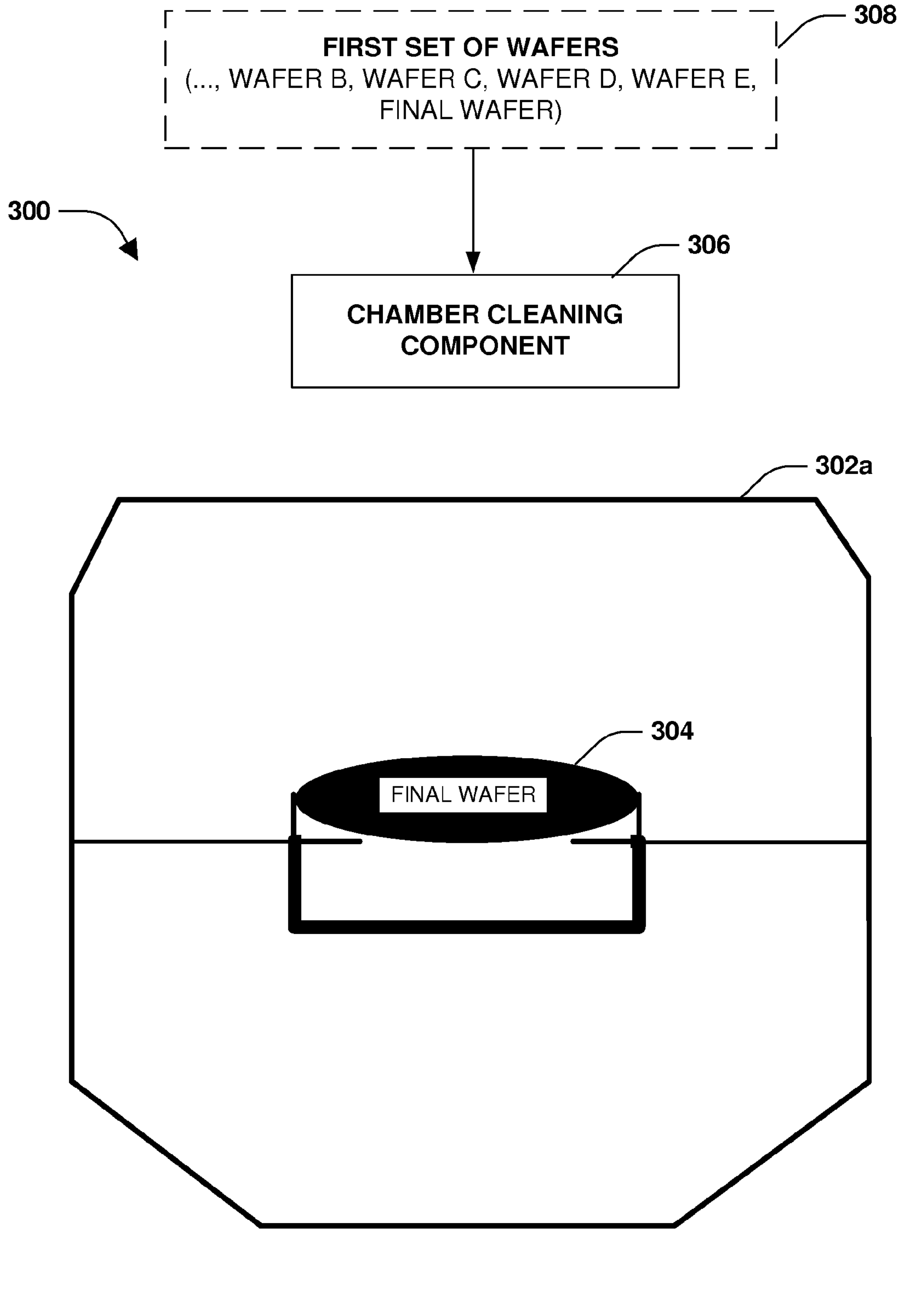
FIG. 3A is an illustration of a final wafer within a processing chamber, in accordance with some embodiments.
Figure 3B:
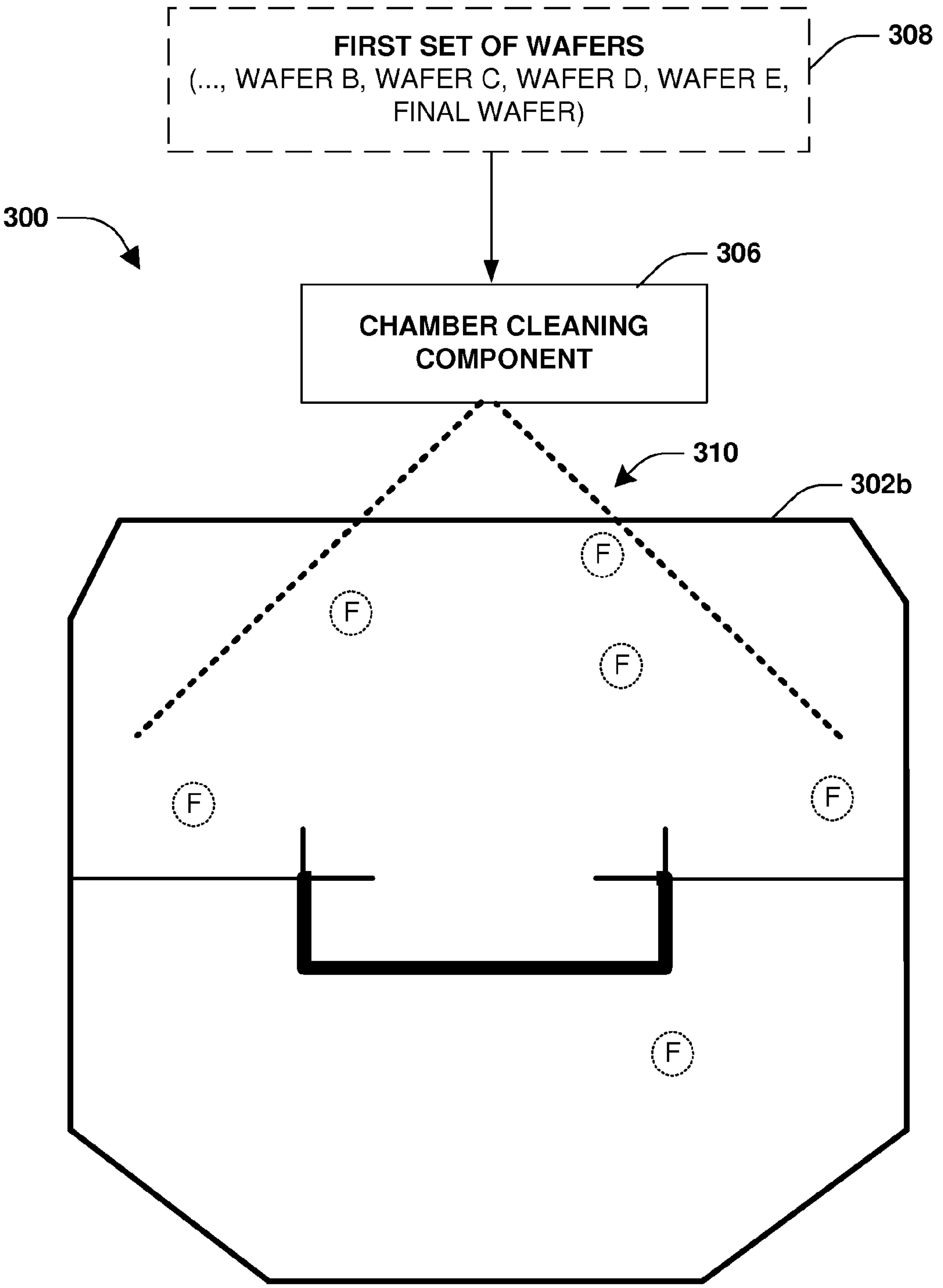
FIG. 3B is an illustration of cleaning a processing chamber, in accordance with some embodiments.
Figure 3C:
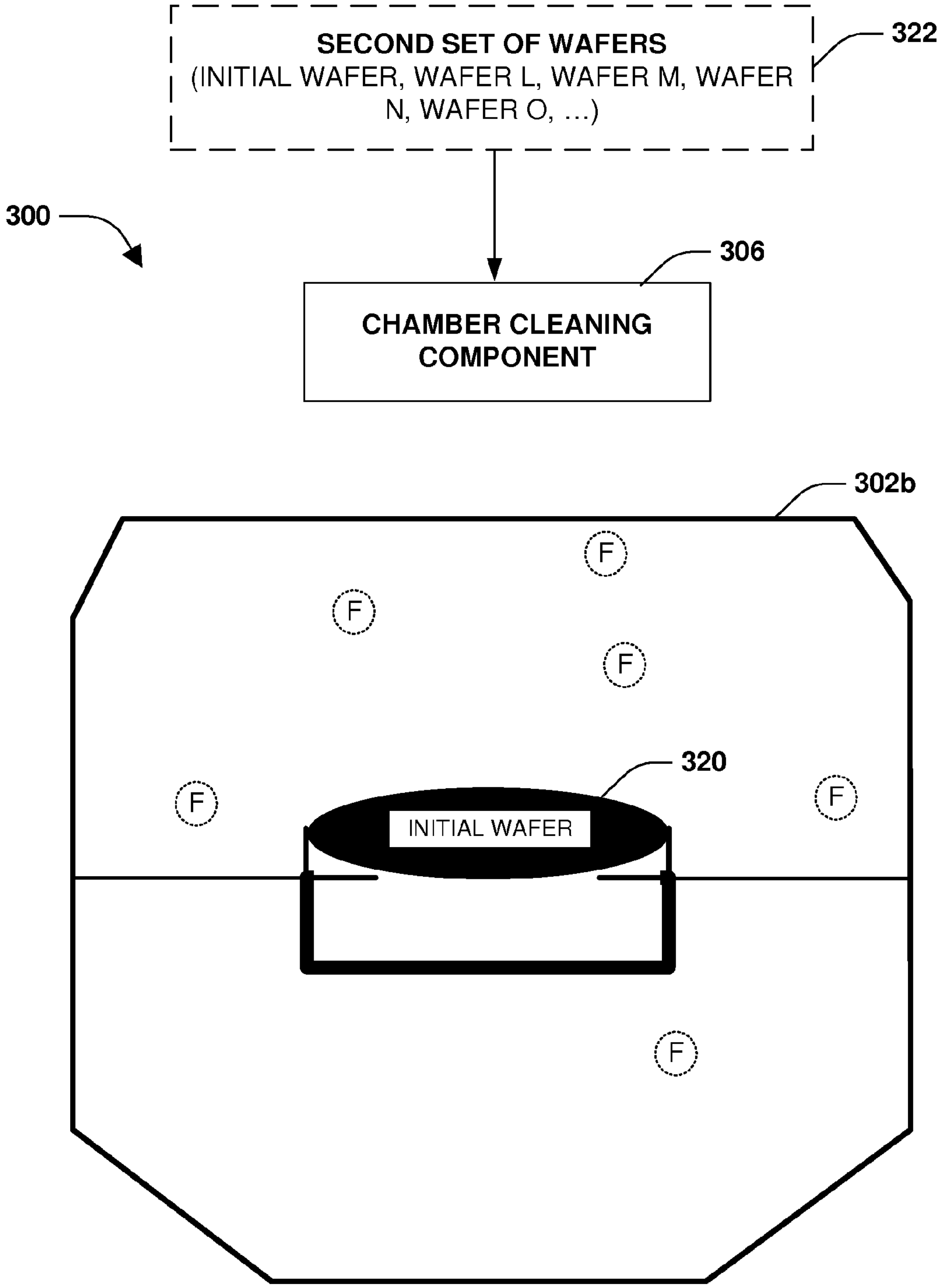
FIG. 3C is an illustration of an initial wafer within a cleaned processing chamber, in accordance with some embodiments.

FIGS. 3A-3E illustrate a system 300 for controlling target dimensions of wafers. The system 300 comprise a chamber cleaning component 306, as illustrated in FIG. 3A. The chamber cleaning component 306 is configured to determine that a processing chamber 302*a* has completed processing of a final wafer 304 within a first set of wafers 308 processed, such as etched, by the processing chamber 302*a*. The final wafer 304 has a final target dimension corresponding to a target dimension, such as a width constraint for structures formed within wafers, specified for the first set of wafers 308. The chamber cleaning component 306 is configured to perform a post wafer cleaning process 310 of the processing chamber 302*a*, resulting in a cleaned processing chamber 302*b*. In some embodiments, a cleaning by-product, such as fluorine, remains within the cleaned processing chamber 302*b*. As more cleaning by-products accumulate within the cleaned processing chamber 302*b*, target dimensions of subsequently processed wafers are affected, which can otherwise result in non-uniformity between target dimensions of wafers processed within the first set of wafers 308 and a subsequent set of wafers. Accordingly, the chamber cleaning component 306 is configured to disable a pre wafer cleaning process that would otherwise be performed between the processing of the final wafer 304 and the processing of an initial wafer 320 of a second set of wafers 322 that are to be processed after the first set of wafers 308, as illustrated in FIG. 3C. Disabling the pre wafer cleaning process will mitigate additional cleaning by-products from accumulating within the cleaned processing chamber 302*b*, which would otherwise result from enablement of the pre wafer cleaning process.

Responsive to determining that the cleaning processing chamber 302*b* is ready to begin processing the initial wafer 320, the cleaned processing chamber 302*b* is coated, such as with a polymer, to create a coated processing chamber. In some embodiments, the coated processing chamber has an initial cleaning byproduct concentration for processing the initial wafer 320 that is substantially similar to a final cleaning byproduct concentration used to process the final wafer 304. In this way, the initial wafer 320 is processed, such as etched, within the coated processing chamber. An initial target dimension of the initial wafer 320 corresponds to, such as being substantially similar to, the final target dimension of the final wafer 304 because the initial cleaning byproduct concentration corresponds to the final cleaning byproduct concentration.

Figure 3D:
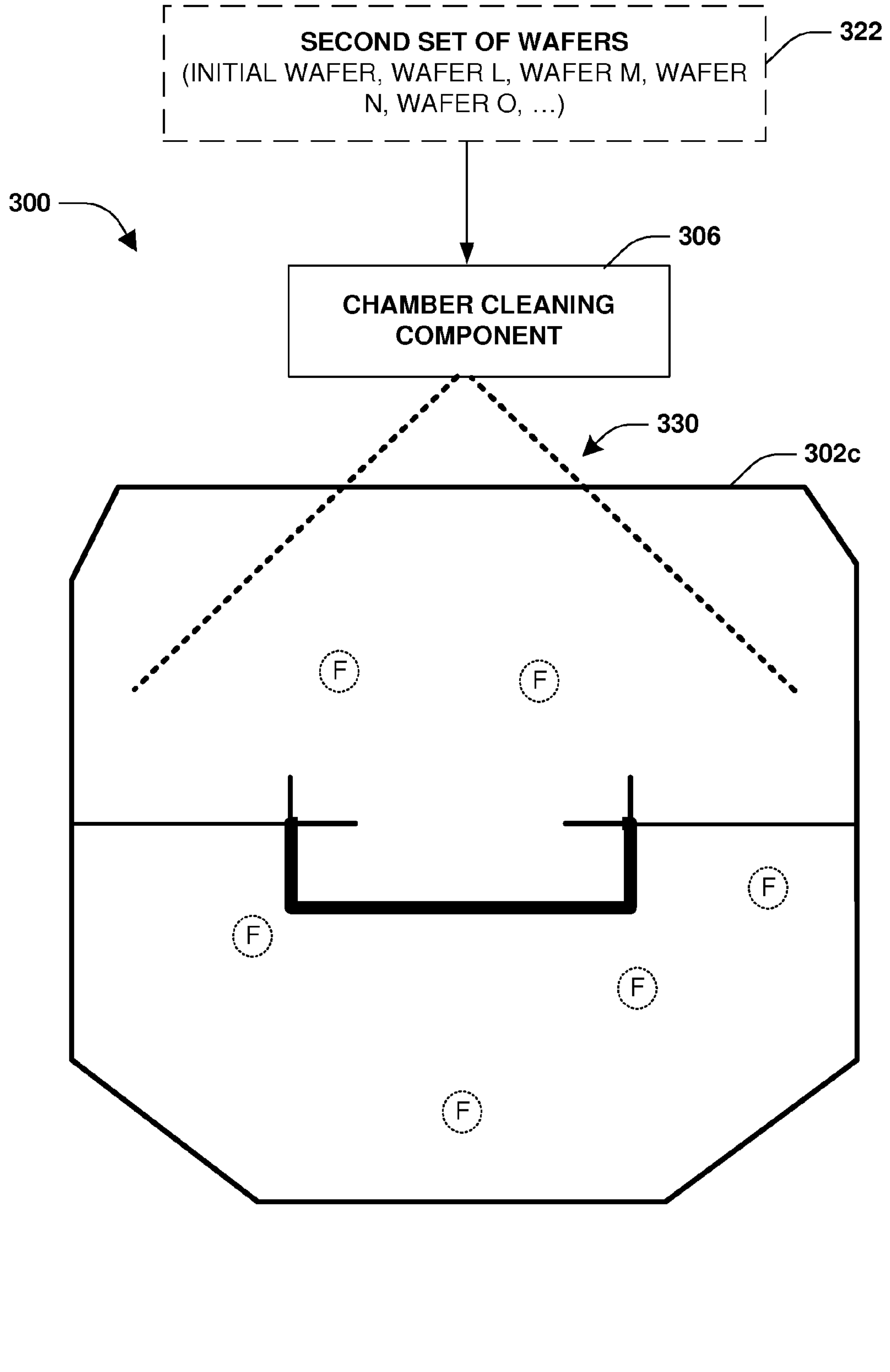
FIG. 3D is an illustration of cleaning a processing chamber, in accordance with some embodiments.
Figure 3E:
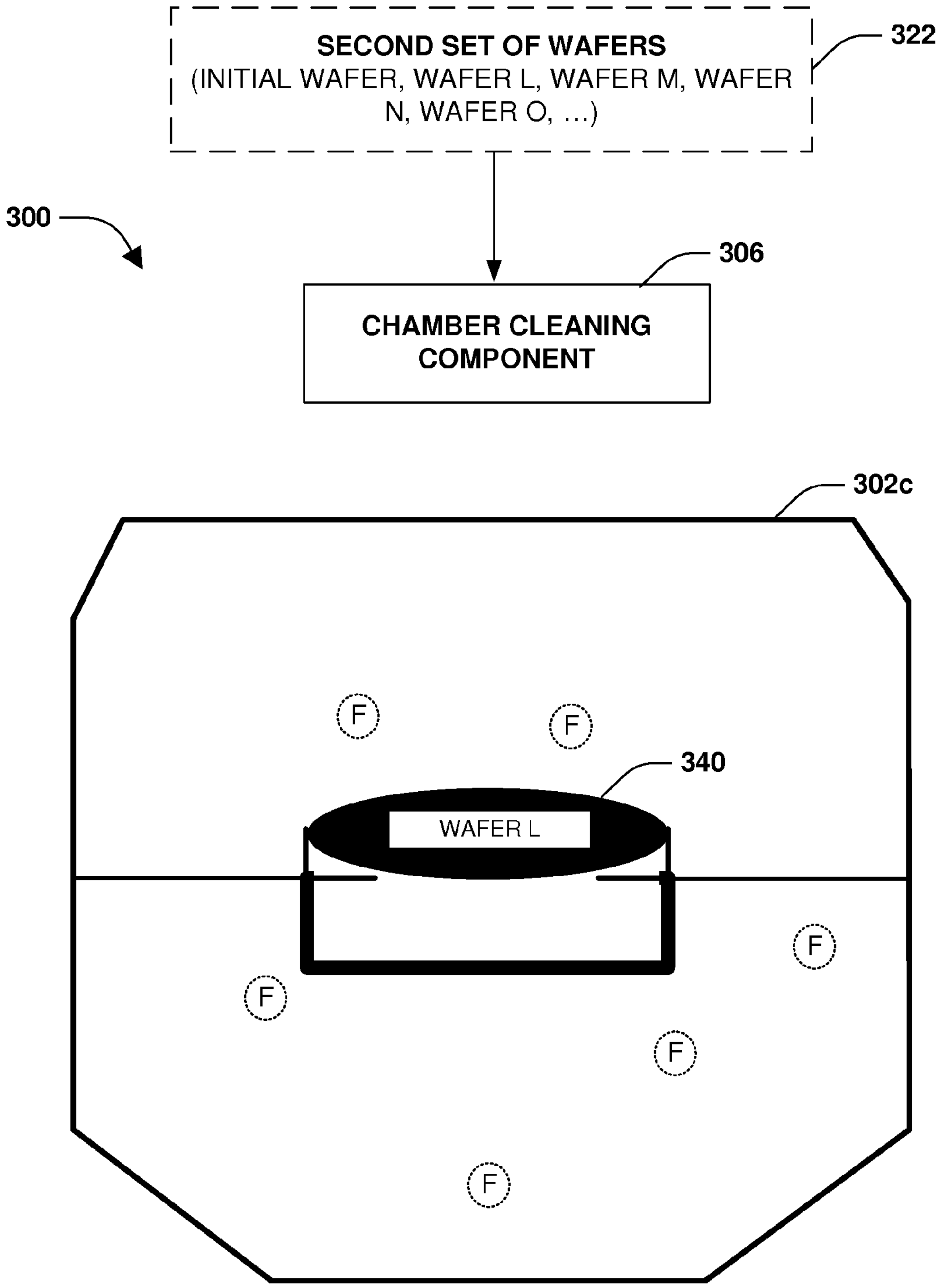
FIG. 3E is an illustration of a wafer within a cleaned processing chamber, in accordance with some embodiments.

The chamber cleaning component 306 is configured to perform a second post wafer cleaning process 330 to clean the coated processing chamber 302*b*, resulting in a second cleaned processing chamber 302*c*, as illustrated in FIG. 3D. The second cleaned processing chamber 302*c* has a cleaning byproduct concentration that is substantially similar to the initial cleaning byproduct concentration and the final cleaning byproduct concentration. Responsive to determining that the second cleaned processing chamber 302*c* is ready to process a wafer (L) 340 of the second set of wafers 322, as illustrated in FIG. 3E, the second cleaned processing chamber 302*c* is coated to create a second coated processing chamber within which the wafer (L) 340 will be processed. In this way, target dimensions of the final wafer 304, the initial wafer 320, the wafer (L) 340, and other wafers are substantially similar because the processing chamber has substantially similar cleaning byproduct concentrations.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Further, unless specified otherwise, “first,” “second,” and/or the like are not intended to imply a temporal aspect, a spatial aspect, an ordering, etc. Rather, such terms are merely used as identifiers, names, etc. for features, elements, items, etc. For example, a first object and a second object generally correspond to object A and object B or two different or two identical objects or the same object.

Moreover, “exemplary” is used herein to mean serving as an example, instance, illustration, etc., and not necessarily as advantageous. As used herein, “or” is intended to mean an inclusive “or” rather than an exclusive “or”. In addition, “a” and “an” as used in this application are generally to be construed to mean “one or more” unless specified otherwise or clear from context to be directed to a singular form. Also, at least one of A and B or the like generally means A or B or both A and B. Furthermore, to the extent that “includes”, “having”, “has”, “with”, or variants thereof are used in either the detailed description or the claims, such terms are intended to be inclusive in a manner similar to “comprising”.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

According to an aspect of the instant disclosure, a system for controlling a target dimension for a wafer is provided. The system comprises a chamber coating component. The chamber coating component is configured to identify a first wafer of a set of wafers to be etched by a first etching process within a processing chamber. The chamber coating component is configured to perform a first coating process to coat the processing chamber with a material according to an increased thickness setting, resulting in a first coated processing chamber comprising a first chamber coating having a first coating thickness. The chamber coating component is configured to initiate performance of the first etching process on the first wafer within the first coated processing chamber to create an etched first wafer. The chamber coating component is configured to identify a second wafer of the set of wafers to be subsequently etched by a second etching process within the processing chamber. The chamber coating component is configured to perform a second coating process to coat the processing chamber with the material according to a standard thickness setting, resulting in a second coated processing chamber comprising a second chamber coating having a second coating thickness different than the first coating thickness. The chamber coating component is configured to initiate performance of the second etching process on the second wafer within the second coated processing chamber to create an etched second wafer.

According to an aspect of the instant disclosure, a system for controlling a target dimension for a wafer is provided. The system comprises a chamber cleaning component. The chamber cleaning component is configured to determine that a processing chamber has completed processing of a final wafer within a first set of wafers processed by the processing chamber. The chamber cleaning component performs a post wafer cleaning process of the processing chamber, resulting in a cleaned processing chamber. The chamber cleaning component is configured to determine that the cleaned processing chamber is ready to begin processing an initial wafer of a second set of wafers. The chamber cleaning component is configured to initialize coating of the cleaned processing chamber to create a coated processing chamber. The chamber cleaning component is configured to initialize processing of the initial wafer within the coated processing chamber.

According to an aspect of the instant disclosure, a method for controlling a target dimension for a wafer is provided. During processing of a first wafer within a processing chamber, the method comprises performing a first coating process to coat the processing chamber with a polymer according to an increased thickness setting, resulting in a first coated processing chamber comprising a first chamber coating having a first coating thickness. Performance of a first etching process on the first wafer within the first coated processing chamber is initialized to create an etched first wafer. During processing of a second wafer within the processing chamber, the method comprises performing a second coating process to coat the processing chamber with the polymer according to a standard thickness setting, resulting in a second coated processing chamber having a second coating thickness different than the first coating thickness. Performance of the second etching process on the second wafer within the second coated processing chamber is initialized to create an etched second wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for controlling a target dimension for a wafer, comprising:

during processing of a first wafer within a processing chamber:

performing a first coating process to coat the processing chamber with a polymer according to an increased thickness setting, resulting in a first coated processing chamber comprising a first chamber coating having a first coating thickness; and initializing performance of a first etching process on the first wafer within the first coated processing chamber to create an etched first wafer; and during processing of a second wafer within the processing chamber:

performing a second coating process to coat the processing chamber with the polymer according to a standard thickness setting, resulting in a second coated processing chamber comprising a second chamber coating having a second coating thickness different than the first coating thickness; and initializing performance of a second etching process on the second wafer within the second coated processing chamber to create an etched second wafer.

2. The method of claim 1, comprising:

after processing of a previous wafer within the processing chamber and before performing the first coating process:

performing a post wafer cleaning process of the processing chamber; and disabling a pre wafer cleaning process between processing of the previous wafer and processing of the first wafer.

3. The method of claim 2, the etched first wafer having a first target dimension, the etched second wafer having a second target dimension, and the previous wafer having a third target dimension, the first target dimension, the second target dimension, and the third target dimension having substantially similar dimensions.

4. The method of claim 1, the first coating thickness greater than the second coating thickness.

5. The method of claim 1, the increased thickness setting specifying a first time duration for coating the processing chamber with the polymer and the standard thickness setting specifying a second time duration for coating the processing chamber, the first time duration different than the second time duration.

6. The method of claim 5, the first time duration greater than the second time duration.

7. The method of claim 1, the first etching process corresponding to a dry etching process.

8. The method of claim 1, the performing a first coating process comprising:

coating a wall of the processing chamber between an anode and a cathode with the polymer.

9. The method of claim 8, wherein a delta voltage associated with the anode and the cathode is a function of a thickness of the polymer disposed between the anode and the cathode.

10. The method of claim 1, the first coating thickness between about 1000 and about 1400 angstroms.

11. A method for controlling a target dimension for a wafer, comprising:

during processing of a first wafer within a processing chamber:

performing a first coating process to coat a wall of the processing chamber with a material until a thickness of the material corresponds to a first coating thickness; and etching the first wafer while the wall is coated with the material having the first coating thickness; and during processing of a second wafer within the processing chamber:

performing a second coating process to coat the wall of the processing chamber with the material until the thickness of the material corresponds to a second coating thickness different than the first coating thickness; and etching the second wafer while the wall is coated with the material having the second coating thickness.

12. The method of claim 11, the first coating thickness greater than the second coating thickness.

13. The method of claim 11, the performing a first coating process comprising applying the material to the wall for a first time duration and the performing a second coating process comprising applying the material to the wall for a second time duration different than the first time duration.

14. The method of claim 13, the first time duration greater than the second time duration.

15. The method of claim 11, the material comprising a polymer.

16. The method of claim 11, the etching the first wafer comprising performing a dry etching process on the first wafer.

17. The method of claim 11, the wall disposed between a cathode and an anode of the processing chamber.

18. The method of claim 11, comprising performing a post wafer cleaning process of the processing chamber after the first wafer is etched and before the second wafer is etched.

19. The method of claim 11, the first coating thickness between about 1000 angstroms to about 1400 angstroms.

20. A method for controlling a target dimension for a wafer, comprising:

during processing of a first wafer within a processing chamber:

performing a first coating process for a first time duration to coat the processing chamber with a polymer; and performing a first etching process after completion of the first coating process to etch a first wafer; and during processing of a second wafer within the processing chamber:

performing a second coating process for a second time duration, different than the first time duration, to coat the processing chamber with the polymer; and performing a second etching process after completion of the second coating process to etch a second wafer.

* * * * *